United States Patent
Lin et al.

(10) Patent No.: US 7,545,093 B2
(45) Date of Patent: Jun. 9, 2009

(54) ORGANIC ELECTRO-LUMINESCENT DEVICE

(75) Inventors: Cheng-Hung Lin, Changhua County (TW); Chun-Hui Yang, Hualien County (TW); Chung-Wen Ko, Taipei County (TW)

(73) Assignee: AU Optronics Corp., Hsinchu (TW)

( * ) Notice: Subject to any disclaimer, the term of this patent is extended or adjusted under 35 U.S.C. 154(b) by 450 days.

(21) Appl. No.: 11/424,014

(22) Filed: Jun. 14, 2006

(65) Prior Publication Data
US 2007/0194703 A1 Aug. 23, 2007

(30) Foreign Application Priority Data
Feb. 23, 2006 (TW) ................ 95106082 A

(51) Int. Cl.
*H01J 1/62* (2006.01)
(52) U.S. Cl. ............ 313/504; 313/506; 257/40
(58) Field of Classification Search ........ 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25
See application file for complete search history.

(56) References Cited

U.S. PATENT DOCUMENTS 6,885,025 B2 * 4/2005 Tung et al. ............... 257/40
2003/0197467 A1 * 10/2003 Adachi et al. ............. 313/504
2003/0230980 A1 12/2003 Forrest et al.
2005/0123794 A1 6/2005 Deaton et al.
2006/0158104 A1 * 7/2006 Iijima et al. ............... 313/504
2006/0232194 A1 * 10/2006 Tung et al. ................ 313/504
2006/0273714 A1 * 12/2006 Forrest et al. ............. 313/504

FOREIGN PATENT DOCUMENTS

CN 1790768 6/2006
JP 2004031211 1/2004

OTHER PUBLICATIONS

CN Office Action mailed Apr. 10, 2008.
English abstract of CN1790768.

* cited by examiner

*Primary Examiner*—Peter J Macchiarolo
*Assistant Examiner*—Donald L Raleigh
(74) *Attorney, Agent, or Firm*—Thomas, Kayden, Horstemeyer & Risley

(57) ABSTRACT

An organic electro-luminescent device. The device comprises two electrodes and an organic electro-luminescent structure interposed therebetween. The electrodes are disposed on a substrate, one serving as an anode and the other as a cathode. The organic electro-luminescent structure comprises a fluorescent emissive layer, a phosphorescent emissive layer and a nondoped organic material layer interposed therebetween. The phosphorescent emissive layer has a host material. The nondoped organic material layer has a highest occupied molecular orbital (HOMO) energy level no higher than that of the host material in the phosphorescent emissive layer.

9 Claims, 2 Drawing Sheets

ORGANIC ELECTRO-LUMINESCENT DEVICE

BACKGROUND OF THE INVENTION

1. Field of the Invention

The invention relates to a flat panel display (FPD), and in particular to an organic electro-luminescent device improving quenching effect at the interface between the phosphorescent and the fluorescent materials.

2. Description of the Related Art

Organic electro-luminescent devices or organic light-emitting diodes (OLEDs) are active lighting devices using organic materials. Compared with conventional liquid crystal displays (LCDs), OLEDs are easily fabricated. Additionally, displays utilizing OLEDs require no backlight module, whereby the manufacturing process is simpler and costs are reduced. OLED technology is highly developed and can be employed in small panels such as those in personal digital assistants (PDAs) or digital cameras.

The organic electro-luminescent device typically comprises an anode, a cathode, and an organic electro-luminescent layer disposed therebetween. The organic electro-luminescent layer may comprise a hole transport layer (HTL) adjacent to the anode, an electron transport layer (ETL) adjacent to the cathode and a light emissive layer interposed therebetween. When an electrical potential difference is applied between the anode and the cathode, electrons are injected into the electron transport layer from the cathode and pass through the electron transport layer and the light emissive layer. At the same time, holes are injected into the hole transport layer from the anode and pass therethrough. The injected electrons and holes are recombined at the interface of the light emissive layer and the hole transport layer, releasing energy as light.

In a white organic electro-luminescent device, the organic electro-luminescent layer typically comprises a blue fluorescent material layer and green and red phosphorescent material layers. However, quenching may occur at the interface between the fluorescent material layer and the phosphorescent material layer, reducing the OLED brightness, making it difficult to improve device efficiency. Accordingly, there is a need to develop efficient OLEDs that are able to mitigate the quenching effect.

BRIEF SUMMARY OF THE INVENTION

A detailed description is given in the following embodiments with reference to the accompanying drawings. An embodiment of an organic electro-luminescent device comprises two electrodes and an organic electro-luminescent structure interposed therebetween. The electrodes are disposed on a substrate, one serving as an anode and the other as a cathode. The organic electro-luminescent structure comprises a fluorescent emissive layer, a phosphorescent emissive layer and a nondoped organic material layer interposed therebetween. The phosphorescent emissive layer has a host material. The nondoped organic material layer has a highest occupied molecular orbital (HOMO) energy level no higher than that of the host material in the phosphorescent emissive layer.

An embodiment of an organic electro-luminescent device comprises two electrodes and an organic electro-luminescent structure interposed therebetween. The electrodes are disposed on a substrate, one serving as an anode and the other as a cathode. The organic electro-luminescent structure comprises a fluorescent emissive layer, a phosphorescent emissive layer and a nondoped organic material layer interposed therebetween. The phosphorescent emissive layer has a host material. The nondoped organic material layer is composed only of the host material.

An embodiment of an organic electro-luminescent device. The device comprises an anode, a fluorescent emissive layer composed of a blue fluorescent material, a nondoped carbazole biphenyl layer, a phosphorescent emissive layer composed of green and red phosphorescent materials, and a cathode. The anode is disposed on a substrate. The fluorescent emissive layer, the nondoped carbazole biphenyl layer and the phosphorescent emissive layer are successively disposed on the anode, in which the phosphorescent emissive layer uses carbazole biphenyl as a host material. The cathode is disposed on the phosphorescent emissive layer.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
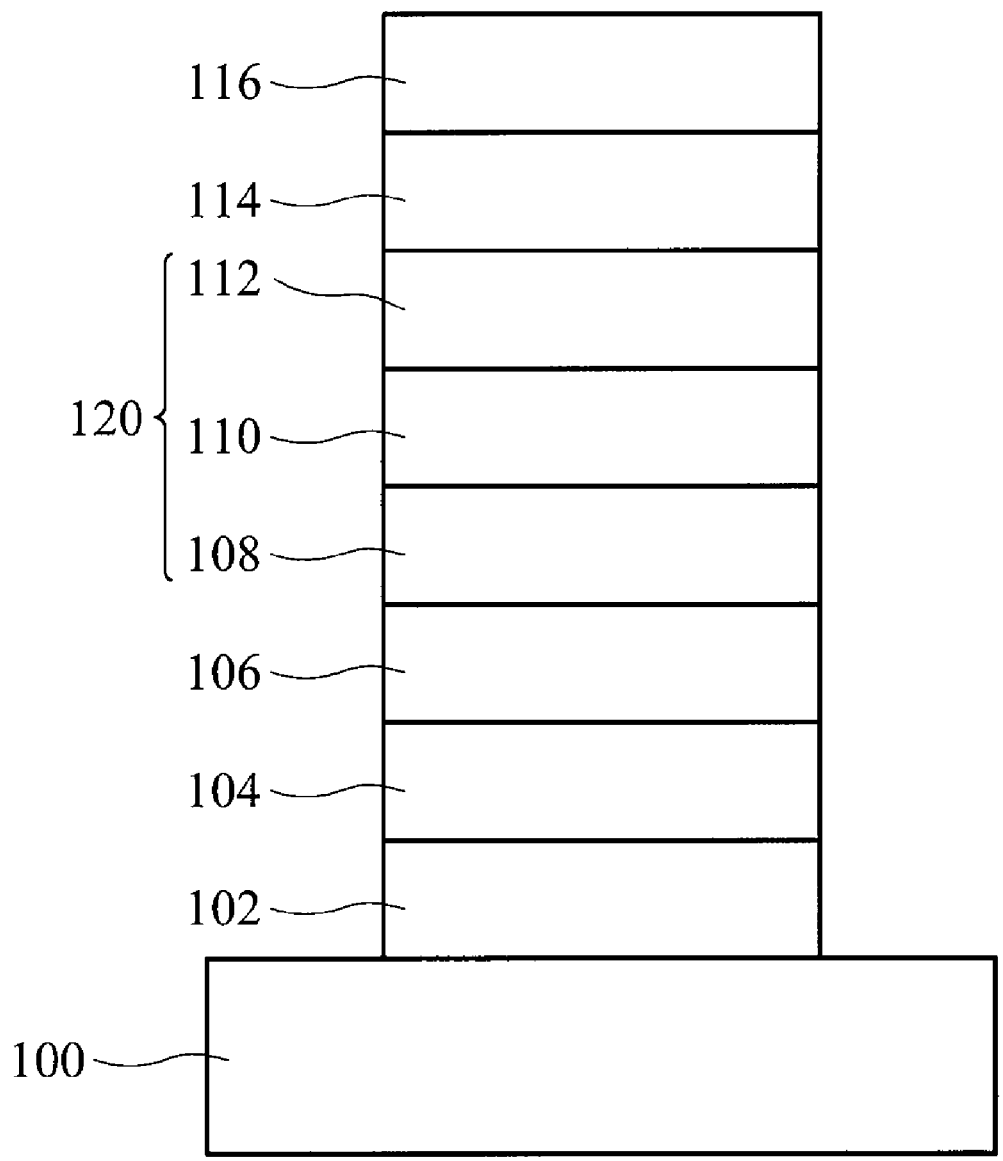
FIG. 1 is a cross-section of an embodiment of an organic electro-luminescent device.

The invention relates to an improved organic electro-luminescent device. FIG. 1 illustrates an embodiment of an organic electro-luminescent device. As shown in FIG. 1, the organic electro-luminescent device 10 comprises a substrate 100, two electrodes 102 and 116, a hole injection layer (HIL) 104, a hole transport layer (HTL) 106, an electron transport layer (ETL) 114 and an organic electro-luminescent structure 120. Two electrodes 102 and 116 are disposed on the substrate 100 opposite to each other, serving as an anode and a cathode, respectively, for example, with electrode 102 serveing as an anode and electrode 116 as a cathode. In this embodiment, the anode 102 and/or the cathode 116 may comprise a single conductive layer or a stacked conductive structure. The material of the anode 102 and/or the cathode 116 may comprise transparent conductive materials or metal materials, such as indium tin oxide (ITO), indium zinc oxide (IZO), silver, aluminum, or a combination thereof.

The hole injection layer 104 and the hole transport layer 106 are successively disposed on the anode 102. In this embodiment, the hole injection layer 104 may be composed of 406 (trade number, produced by Idemitsu Co.):F4 (2,3,5,6-Tetrafluoro-7,7,8,8-tetracyanoquinodimethane) (trade number, produced by Uni-onward CO), in which 406 is used as a host material and F4 is used as a guest material. The guest material has a doping concentration of about 2%. Moreover, the hole injection layer 104 has a thickness of about 1000 Å to 2000 Å, with 1500 Å is preferable.

The hole transport layer 106 overlying the hole injection layer 104 may comprise naphtha-phenyl benzidene (NPB). Moreover, the hole transport layer 106 has a thickness of about 100 Å to 300 Å, with 200 Å is preferable.

The organic electro-luminescent structure 120 is disposed on the hole transport layer 106, comprising a fluorescent emissive layer 108, a phosphorescent emissive layer 112 and a nondoped organic material layer 110 interposed therebetween. In this embodiment, a fluorescent emissive layer 108 may be composed of a blue fluorescent material. For example, the fluorescent emissive layer 108 may be composed of BH215 (trade number, produced by Idemitsu Co.):B52 (trade number, produced by Idemitsu Co.), in which BH215 is used as a host material and B52 is used as a guest material. The guest material has a doping concentration of about 5%. Moreover, the fluorescent emissive layer 108 has a thickness of about 200 Å to 300 Å, with 250 Å is preferable.

The phosphorescent emissive layer 112 may comprise a stack of a green phosphorescent material layer and a red phosphorescent material layer. In order to simplify the diagram, only a single layer is depicted. For example, the phosphorescent emissive layer 112 may be composed of CBP (carbazole biphenyl):GD33 (trade number, produced by Universal Display Co.) and CBP (carbazole biphenyl):RD07 (trade number, produced by Universal Display Co.), in which CBP is used as a host material and GD33 and RD07 are used as guest materials for the green and red phosphorescent material layers, respectively. GD33 has a doping concentration of about 3% and RD07 has a doping concentration of about 12%. Moreover, the green phosphorescent material layer has a thickness of about 10 Å to 100 Å, with 50 Å is preferable. The red phosphorescent material layer has a thickness of about 50 Å to 200 Å, with 100 Å is preferable.

In this embodiment, the nondoped organic material layer 110 interposed between the fluorescent emissive layer 108 and the phosphorescent emissive layer 112 has a highest occupied molecular orbital (HOMO) energy level not exceeding that of the host material in the phosphorescent emissive layer 112. For example, the nondoped organic material layer 110 may be composed of mCP (N,N'-dicarbazolyl-3,5-dibenzene), BAlq (Bis-(2-methyl-8-quinolinolate)-4-(phenylphenolato)-aluminum) or be composed only of the host material in the phosphorescent emissive layer 112, such as CBP. Moreover, the nondoped organic material layer 110 has a thickness not exceeding 100 Å. The nondoped organic material layer 110 serves as a buffer layer between the fluorescent emissive layer 108 and the phosphorescent emissive layer 112, thereby mitigating quenching effect. Additionally, in this embodiment, the nondoped organic material layer 110 represents an organic material layer without doping any guest material. Therefore, the organic electro-luminescent device 10 with the additional buffer layer 110 does not change the original light-emitting color.

The electron transport layer 114 is disposed on the organic electro-luminescent structure 120. In this embodiment, the electron transport layer 114 may comprise BAlq. Moreover, the electron transport layer 114 has a thickness of about 300 Å to 500 Å, with 400 Å is preferable. Additionally, an electron injection layer (not shown) may interposed between the electron transport layer 114 and the cathode 116, which may be composed of LiF and has a thickness of 10 Å.

Figure 2:
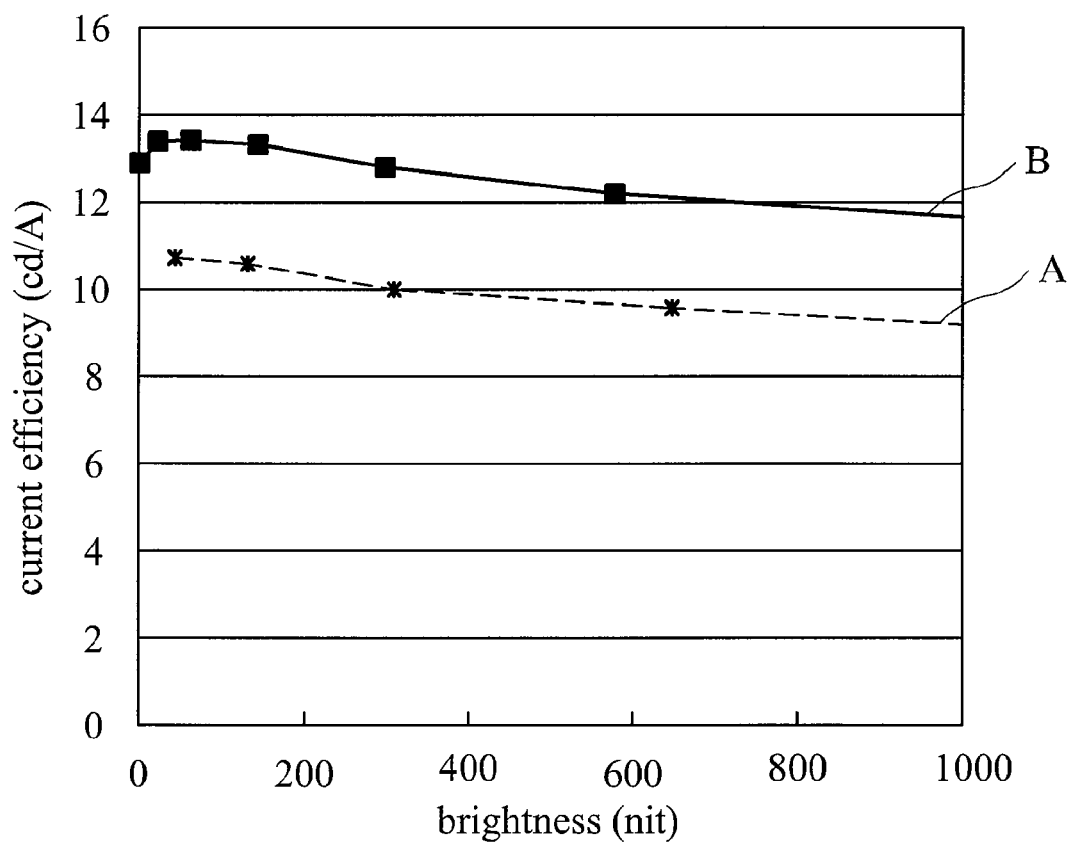
FIG. 2 is a diagram showing the relationship between the current efficiency and brightness.

FIG. 2 is a diagram showing the relationship between the current efficiency (cd/A) and brightness (nit), in which curve A represents a conventional organic electro-luminescent device without a buffer layer and curve B represents an organic electro-luminescent device with a buffer layer according to the invention. As shown in FIG. 2, the organic electro-luminescent device with a buffer layer can effectively mitigate the quenching effect at the interface between the phosphorescent and the fluorescent materials. Accordingly, current efficiency of the organic electro-luminescent device is increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electro-luminescent device, comprising:
   a substrate;
   two electrodes disposed on the substrate, one serving as an anode and the other as a cathode; and
   an organic electro-luminescent structure interposed between the electrodes, comprising:
      a fluorescent emissive layer;
      a phosphorescent emissive layer having a host material; and
      a nondoped organic material layer interposed between the fluorescent emissive layer and the phosphorescent emissive layer, having a highest occupied molecular orbital energy level lower than that of the host material in the phosphorescent emissive layer.

2. The device as claimed in claim 1, further comprising:
   a hole injection layer disposed on the anode;
   a hole transport layer interposed between the hole injection layer and the organic electro-luminescent structure; and
   an electron transport layer interposed between the cathode and the organic electro-luminescent structure.

3. The device as claimed in claim 1, wherein the nondoped organic material layer has a thickness not exceeding 100 Å.

4. The device as claimed in claim 1, wherein the fluorescent emissive layer comprises a blue fluorescent material.

5. The device as claimed in claim 1, wherein the phosphorescent emissive layer comprises green and red phosphorescent materials.

6. The device as claimed in claim 1, wherein the host material in the phosphorescent emissive layer comprises carbazole biphenyl.

7. An organic electro-luminescent device, comprising:
   a substrate;
   an anode disposed on the substrate;
   a fluorescent emissive layer comprising a blue fluorescent material disposed on the anode;
   a nondoped organic material layer disposed on the blue fluorescent material layer;
   a phosphorescent emissive layer comprising green and red phosphorescent materials disposed on the nondoped organic material layer, using carbazole biphenyl as a host material; and
   a cathode disposed on the phosphorescent emissive layer;
   wherein the nondoped organic material layer has a highest occupied molecular orbital enemy level lower than that of the host material in the phosphorescent emissive layer.

8. The device as claimed in claim 7, wherein the nondoped organic material layer has a thickness not exceeding 100 Å.

9. The device as claimed in claim 7, further comprising:
   a hole injection layer interposed between the anode and the fluorescent emissive layer;
   a hole transport layer interposed between the hole injection layer and the fluorescent emissive layer; and
   an electron transport layer interposed between the cathode and the phosphorescent emissive layer.

* * * * *